United States Patent [19]
Sopori

[11] Patent Number: 5,429,985
[45] Date of Patent: Jul. 4, 1995

[54] FABRICATION OF OPTICALLY REFLECTING OHMIC CONTACTS FOR SEMICONDUCTOR DEVICES

[75] Inventor: Bhushan L. Sopori, Denver, Colo.

[73] Assignee: Midwest Research Institute, Kansas City, Mo.

[21] Appl. No.: 155,386

[22] Filed: Jan. 18, 1994

[51] Int. Cl.⁶ .................... H01L 21/28; H01L 21/324
[52] U.S. Cl. .................... 437/173; 437/188; 437/199; 437/247
[58] Field of Search ............... 437/173, 174, 908, 199, 437/187, 188, 247, 248; 148/DIG. 90, DIG. 93

[56] References Cited

U.S. PATENT DOCUMENTS

| | | | |
|---|---|---|---|
| 4,151,008 | 4/1979 | Kirkpatrick | 437/19 |
| 4,321,104 | 3/1982 | Hasegawa et al. | 156/643 |
| 4,331,485 | 5/1982 | Gat | 437/16 |
| 4,335,362 | 6/1982 | Salathe et al. | 372/46 |
| 4,350,537 | 9/1982 | Young et al. | 437/16 |
| 4,359,486 | 11/1982 | Patalong et al. | 427/53.1 |
| 4,525,221 | 6/1985 | Wu | 148/1.5 |
| 4,566,177 | 1/1986 | Van de Ven et al. | 29/590 |
| 5,166,095 | 11/1992 | Hwang | 437/188 |
| 5,219,790 | 6/1993 | Miyatake | 437/194 |
| 5,223,453 | 6/1993 | Sopori | 437/173 |
| 5,304,509 | 4/1994 | Sopori | 437/173 |
| 5,358,574 | 10/1994 | Sopori | 136/249 |

FOREIGN PATENT DOCUMENTS

| | | |
|---|---|---|
| 52-63068 | 5/1977 | Japan . |
| 58-56405 | 4/1983 | Japan . |
| 59-214224 | 12/1984 | Japan . |
| 60-783 | 1/1985 | Japan . |
| 61-220416 | 9/1986 | Japan . |
| 2-77121 | 3/1990 | Japan . |

Primary Examiner—T. N. Quach
Attorney, Agent, or Firm—Edna M. O'Connor

[57] ABSTRACT

A method is provided to produce a low-resistivity ohmic contact having high optical reflectivity on one side of a semiconductor device. The contact is formed by coating the semiconductor substrate with a thin metal film on the back reflecting side and then optically processing the wafer by illuminating it with electromagnetic radiation of a predetermined wavelength and energy level through the front side of the wafer for a predetermined period of time. This method produces a thin epitaxial alloy layer between the semiconductor substrate and the metal layer when a crystalline substrate is used. The alloy layer provides both a low-resistivity ohmic contact and high optical reflectance.

23 Claims, 3 Drawing Sheets

FABRICATION OF OPTICALLY REFLECTING OHMIC CONTACTS FOR SEMICONDUCTOR DEVICES

CONTRACTUAL ORIGIN OF THE INVENTION

The United States Government has rights in this invention under Contract No. DEAC0283CH 10093 between the U.S. Department of Energy and the National Renewable Energy Laboratory, a Division of Midwest Research Institute.

BACKGROUND OF THE INVENTION

1. Field of the Invention

The present invention relates generally to the fabrication of semiconductor devices and more particularly to a method of fabricating optically reflective, ohmic contacts on a crystalline semiconductor device.

2. Description of the Prior Art

Forming thin, conductive metal layers on semiconductor substrates is an essential step in the manufacture of microelectronic and opto-electronic devices to provide electrical contacts or current carrying paths to and from the semiconductor material. During manufacture, such thin metal layers, or contacts, are applied to semiconductor substrates, typically silicon, by any one of several well-known deposition techniques, such as vapor deposition, sputtering, or electrolytic precipitation.

It is desirable to create an interface between the semiconductor substrate and the metal layer that has both low resistivity and high optical reflectance. Low resistivity is a primary requirement of any contact on a semiconductor device to reduce the barrier to electron flow between the semiconductor device and the external electronic circuit. It is important, therefore, that the electrical contact be ohmic, even at very high current densities. Newer high efficiency solar cell designs utilize optical confinement techniques to capture and manage incident electromagnetic radiation so that more of it is absorbed in the semiconductor to produce electricity instead of escaping or being absorbed at the contact/crystal interface and dissipated as heat. Optical confinement is facilitated by specularly reflecting interfaces where the contact joins the crystalline material to prevent escape or absorption of the electromagnetic radiation at that interface and reflecting it instead back into the semiconductor for production of electricity. High optical reflectivity, therefore, is important to increase the amount of electromagnetic radiation energy absorbed by the semiconductor material, thereby improving the operation of the semiconductor device by increasing the number of photogenerated electrons available for collection. Unfortunately, it is difficult to provide both of these conditions simultaneously, low resistivity and high optical reflectance, at the semiconductor/metal using conventional methods. An abrupt interface between the semiconductor substrate and the metal produced by conventional methods provides high optical reflection but also creates a high-resistivity ohmic contact. Alternatively, a graded semiconductor-metal interface can provide a low-resistivity ohmic contact but does not provide high optical reflection, since the incident electromagnetic radiation at the interface can propagate into and through the graded interface to the metal and be totally absorbed and dissipated as heat.

While deposition techniques bond the metal layers to the semiconductor substrate, the bond formed by such deposition techniques is usually not sufficient, either mechanically or electrically, to yield reliable, and sometimes even functional, devices. Consequently, the semiconductor must be processed further to improve the bonds between the conductive metal layer and the semiconductor material, for example, by either alloying or sintering the metal layers to the semiconductor surface.

Sintering and alloying are two different processes that are used in semiconductor fabrication and which result in different electrical and mechanical characteristics, such as contact resistance, ohmicity, and bonding. Alloying generally creates a better bond and electrical contact with the semiconductor material because the metal layer and semiconductor material actually melt and meld together. Where semiconductor junctions or other thin film layers are close to the surface, however, such melting for alloying can disrupt or destroy the semiconductor structure or functions. Thus, a slightly lower temperature to produce sintering, which merely breaks down the interface oxide and remains more localized at the interface surfaces, may be more appropriate than alloying in those situations. Also, where there is heavy doping of the silicon, such as near a p-n or n-p junction, electrical contact between the doped silicon and the metal contact is easier to establish. Consequently, sintering, rather than alloying is usually sufficient. Therefore, it has become a general practice in the industry, particularly for solar cells and other opto-electronic devices, to alloy bottom metal contact layers to the bottoms of semiconductor substrates, while the top contacts, which are usually thin strips or grids near the junction, are only sintered to the top surface of the semiconductor material.

In one conventional type of alloying process, metallized semiconductors, i.e., semiconductor substrates with metal contacts deposited thereon, are heated in an alloying furnace to a sufficiently high temperature to melt both the metal and the immediately adjacent substrate material, thereby improving the bond between the two materials and producing the desired electrical and mechanical characteristics. Such furnace alloying is frequently performed at temperatures in excess of 400° C. and for as long as thirty minutes. Exposing the metallized semiconductor to such temperatures in a furnace over such an extended time heats up the entire semiconductor structure uniformly and creates an isothermal condition within the semiconductor. Unfortunately, such heating deep into the semiconductor material tends to produce a detrimental phenomenon known as "spiking." Spiking is caused by the dissolution of certain isolated "weak" pockets in the semiconductor material and subsequent infusion of the metal layer into those dissolved pockets to form metallic intrusions into the surface of the semiconductor material. Spiking can result when the semiconductor and metal device are heated too long or to too high a temperature. Viewed in cross-section, these intrusions of infused metal have an uneven, jagged, or spike-like appearance, thus giving rise to the term "spikes." Depending upon the depth of their penetration, such metal spikes can and often do interfere with various subsurface layers of the semiconductor, including the p-n junction itself, thereby reducing the performance of the semiconductor or even rendering the device inoperative.

Another common problem in conventional furnace alloying processes is the formation of "hillocks" in the metal layer. As the name implies, hillocks are small mounds that form on the surfaces of the metal layer. They are typically about one micrometer in height and may occur in densities of about $10^5$ hillocks per square centimeter. Hillocks create reliability problems by interfering with the subsequent laying down of inter-level electric layers or passivating oxide layers. Such hillocks are the result of compression of the metal as it approaches its melting point. The softening of the metal layer allows the compression forces created by thermal expansion to be relieved in the form of hillocks.

Another problem with the furnace alloying process is that the atmosphere around the metallized semiconductor and the entire furnace are heated along with the individual metal layers or contacts and the semiconductor substrate. Not only does this heating of the atmosphere around the semiconductor waste energy, it also encourages degradation of the electrical characteristics of the metal layers due to atmospheric impurities. One form of this degradation is oxidation, which significantly degrades the electrical characteristics of the metal layer. It is well-known that even small traces of oxygen in the atmosphere surrounding the metallized semiconductor can oxidize the metal layer. Consequently, most furnace alloying processes require that the process be performed in a vacuum, or they require the use of a highly purified inert atmosphere, such as argon or helium, to reduce oxidation of the metal layer. Obviously, the creation of such special, purified environments is both time consuming and expensive.

Several techniques have been developed in attempts to solve these problems of spiking, hillocks, and oxidation associated with the conventional furnace alloying process described previously. One such technique involves heating a graphite strip to a high temperature in an inert environment and then placing the heated graphite strip in contact with the metallized semiconductor. The heat from the graphite strip is transferred to the metallized semiconductor, alloying the metal layer to the semiconductor substrate. The primary advantage associated with graphite heating is that it is easier to control the amount of heat absorbed by the metallized semiconductor, thereby reducing the spiking and hillock problems described previously. This process must still be performed under vacuum or in an inert atmosphere, however, to reduce the chances of oxidation. Further, this process only heats the metallized semiconductor from one side, which may lead to spiking or hillock formation.

Another, more popular alloying technique, commonly referred to as optical processing or rapid thermal alloying (RTA), bombards the metallic depositions on the semiconductor from the solid metal bottom side or from all sides, for a few seconds with pulsed, high intensity visible and infrared light, such as light produced by a high intensity CW visual light lamp. This pulsing of the metallized semiconductor with electromagnetic radiation results in a rapid increase in the temperature of the metal layer and the semiconductor substrate, thereby alloying the metal with the semiconductor substrate. U.S. Pat. No. 4,335,362 to Salathe et al., describes a slight variation of this RTA technique wherein narrow regions of the metallic layers are alloyed with the semiconductor by heating the regions with a focused beam from a Nd:YAG (four-level infrared) laser. Other examples of these techniques can be found in U.S. Pat. No. 4,359,486 to Patalong et al., U.S. Pat. No. 4,525,221 to Wu, and U.S. Pat. No. 4,566,177 to van de Ven et al.

Unfortunately, however, RTA suffers some of the same drawbacks as the furnace alloying process. For example, the RTA process usually illuminates a semiconductor device from both the top and bottom sides, the bottom side typically being the solid metal base or contact. Because the metal deposited on the bottom side is reflective, the outside surface of the bottom metal layer reflects a substantial portion of the incoming electromagnetic radiation back to the surrounding atmosphere, heating both the atmosphere and the outer surface of the metal. Of course, heating the outside surface of the metal enough to alloy the inside surface of the metal to the semiconductor substrate only exacerbates the contamination and oxidation problems described previously. Accordingly, the RTA process must also be performed under vacuum or in an inert environment. Even with such special inert environments, oxidation is still so prevalent in RTA that it is common to redeposit a metal layer over the alloyed metal in an attempt to re-gain the electrical integrity of the oxidized metal.

Therefore, while replacement of the furnace alloying process with RTA processes or techniques has reduced the formation of spikes and hillocks, reduced energy requirements to some extent, and increased throughput, such RTA techniques have not completely eliminated the problems associated with the furnace alloying procedures. For example, the RTA processes have not completely eliminated the formation of spikes and hillocks. Consequently, a certain percentage of metallized semiconductors will still have defective metal to semiconductor bonds, reducing the numbers of functional and reliable devices. Furthermore, although the RTA processes described previously reduce the energy requirements over the furnace alloying process, these processes still require relatively large amounts of optical power to heat the metallized semiconductor to a temperature sufficiently high enough to alloy the bottom layer to the semiconductor substrate, since a large portion of the electromagnetic energy is reflected by the outside surface of the bottom layer. Consequently, the RTA processes still heat the surrounding atmosphere and equipment, including the RTA chamber walls to very high temperatures.

Finally, since both RTA and furnace alloying processes heat the surrounding environment as well as the metal and semiconductor, there is a good chance that the metal contacts will be contaminated by residual traces of oxygen in the ambient surroundings.

SUMMARY OF THE INVENTION

Accordingly, it is another object of this invention to provide a method of alloying a metal electrical contact layer on a semiconductor substrate such that the alloy interface has both low resistivity and high optical reflectivity.

It is yet a further object of this invention to provide a method of alloying a metal layer on a semiconductor substrate in a manner that minimizes or eliminates the formation of spikes and hillocks at the semiconductor/metal interface.

A more specific object of this invention is to provide a method of alloying a metal layer on a semiconductor substrate by optical processing through the front end such that diffusion does not occur and the interface melts uniformly.

Another specific object of this invention is to provide a method of alloying a metal layer on a semiconductor substrate without isothermally heating the entire device or its surroundings such that the alloyed interface is not degraded.

It is yet a further specific object of this invention is to provide a method of optical processing resulting in a highly controlled epitaxial growth of a thin interface layer between the semiconductor substrate and the metal film.

To achieve the foregoing and other objects and in accordance with the purposes of the present invention, as embodied and broadly described therein, the method of this invention includes the alloying of a metallized semiconductor material by illuminating the semiconductor substrate with electromagnetic radiation from the top surface according to a predetermined time schedule of energy levels and only with an electromagnetic spectrum that is tuned to provide sufficient heat to produce a thin alloy layer of the bottom metal layer to the semiconductor substrate. The illuminating radiation, preferably infrared electromagnetic radiation, depending on the materials being used, is substantially transmitted through the semiconductor substrate to the interface between the bottom layer of metal and the bottom surface of the semiconductor substrate. This normally incident radiation at the bottom interface heats the interfacing bottom metal layer and semiconductor substrate material at the interface only to a temperature sufficient to alloy a thin layer of the metal with the semiconductor without the problems of hillocks or spiking. The time-energy profile includes initially ramping incident radiation energy up to a first energy level in a first time interval to heat the semiconductor and metal interface to a staging temperature, and then increasing the incident energy at a more rapid rate, even instantaneously, to a higher second energy level where rapid, almost instantaneous melting occurs across the entire semiconductor/metal interface. The energy is held fairly constant at the second energy level long enough to develop alloying in a thin, abrupt interface layer, and then ramping the energy level down to zero at a rate that allows epitaxial crystal growth in the thin alloy layer.

BRIEF DESCRIPTION OF THE DRAWINGS

The accompanying drawings, which are incorporated in and form a part of the specifications, illustrate the preferred embodiments of the present invention, and together with the descriptions serve to explain the principles of the invention.

In the drawings.

DETAILED DESCRIPTION OF THE PREFERRED EMBODIMENTS

Figure 1:
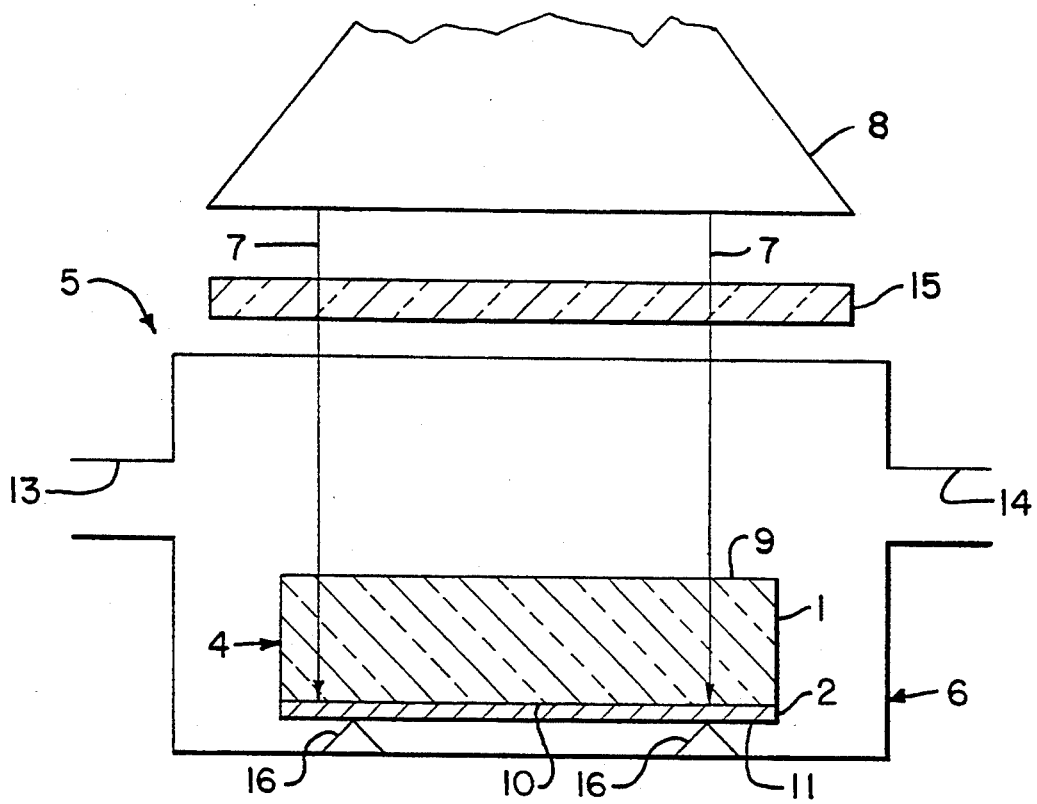
FIG. 1 is a cross-sectional view (not in actual scale or proportion) of a semiconductor device, such as a solar cell, that is being alloyed within a quartz chamber according to this invention such that the metal layer on the bottom of the semiconductor substrate is being alloyed.

An appropriate process set-up 5 for practicing the one-sided infrared light illumination method of alloying the bottom surface 10 of a semiconductor substrate 1 with a metal contact layer 2 according to this invention is illustrated in FIG. 1. The alloying A metallized semiconductor device 4 is positioned in a quartz muffle 6 where it can be illuminated with electromagnetic radiation 7 from an electromagnetic radiation source 8. The electromagnetic radiation will preferably have a predetermined energy level and wavelength according to the time vs. energy profile as illustrated in either FIG. 3 or 4, and which will be described in more detail below. The electromagnetic radiation source 8 in FIG. 1 should be designed so as to illuminate the top surface 9 of the semiconductor material 1 uniformly.

The semiconductor material 1, for example silicon, is largely transparent to the infrared electromagnetic radiation 7 emitted from the electromagnetic radiation source 8. Therefore, most of the incident infrared electromagnetic radiation 7 is transmitted to the bottom surface 10 of the semiconductor material 1, where it is absorbed at the semiconductor/metal interface 10 and by the metal contact layer 2 and convened to heat at the interface 10 and in the metal contact layer 2.

This method of alloying semiconductor 1 and metal 2, according to this invention, without illuminating the back surface 11 of metal 2 is referred to in this specification as one-sided infrared light illumination, because the illumination is directed and applied to be incident on just one side, preferably the top side 9, of the device 4, as opposed to conventional optical alloying in which electromagnetic radiation is directed onto at least the bottom metal side, if not from all directions.

Figure 2:
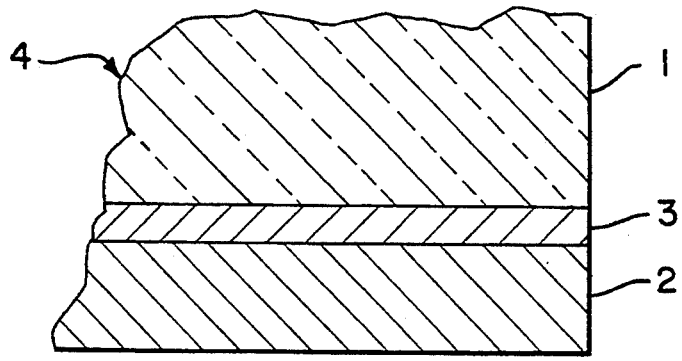
FIG. 2 is an enlargement of the bottom metal layer and semiconductor substrate interface of the semiconductor device of FIG. 3 (not in actual scale or proportion) after the bottom metal layer and semiconductor substrate have been alloyed.

Referring now to FIGS. 1 and 2, the fabrication of a semiconductor device 4 usually begins with a semiconductor substrate 1, such as silicon, that has a top surface 9 and a bottom surface 10. The semiconductor substrate 1 can be doped to include both p-type and n-type semiconductor material or any other semiconductor design, which is not a part of this invention. A metal layer 2 is usually deposited on the bottom surface 10 of the semiconductor substrate 1 to form an electric contact, which deposition is conventional technology and also not a part of this invention. For the purpose of providing a detailed description and an enabling embodiment, but not for the purpose of limitation, this description refers to a silicon semiconductor substrate 1 with a thin layer of aluminum deposited on its bottom surface 10. The method of this invention, however, can be used on all types of metallized semiconductors, and the present invention should not be regarded as limited to the specific metallized semiconductors shown and described herein.

Figure 3:
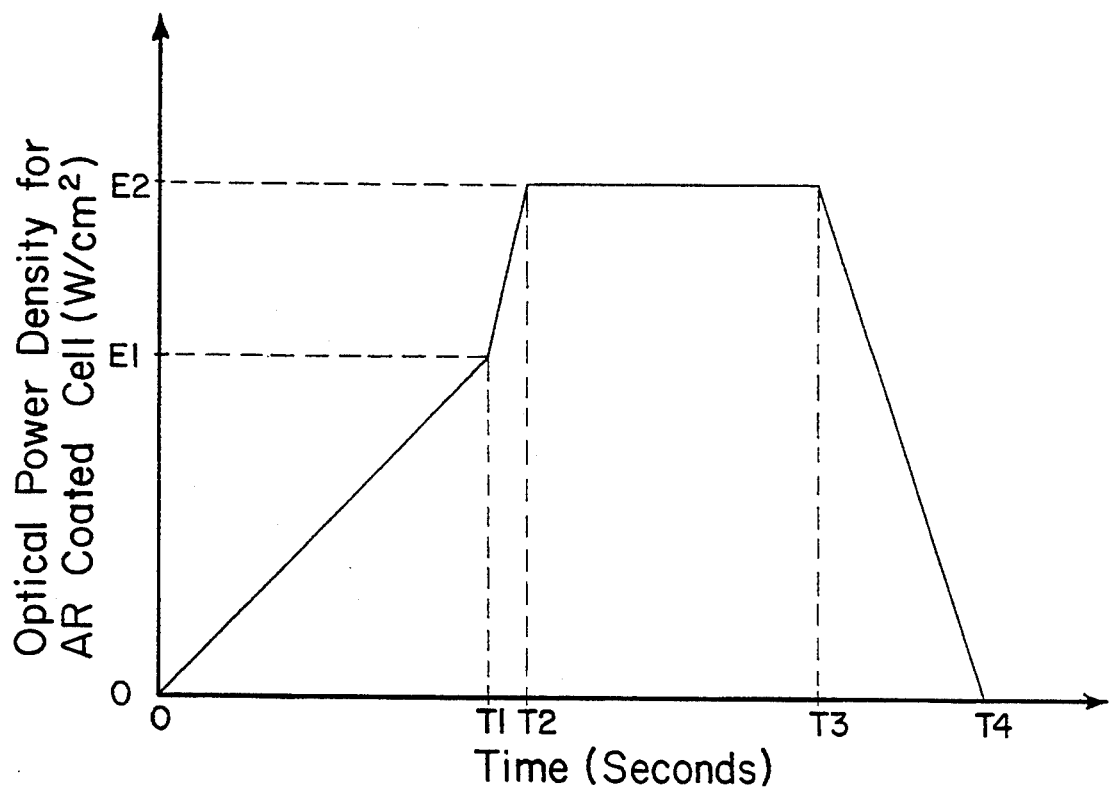
FIG. 3 is a graph or profile of the energy levels versus time of the incident electromagnetic radiation applied to the semiconductor substrate according to this invention.
Figure 4:
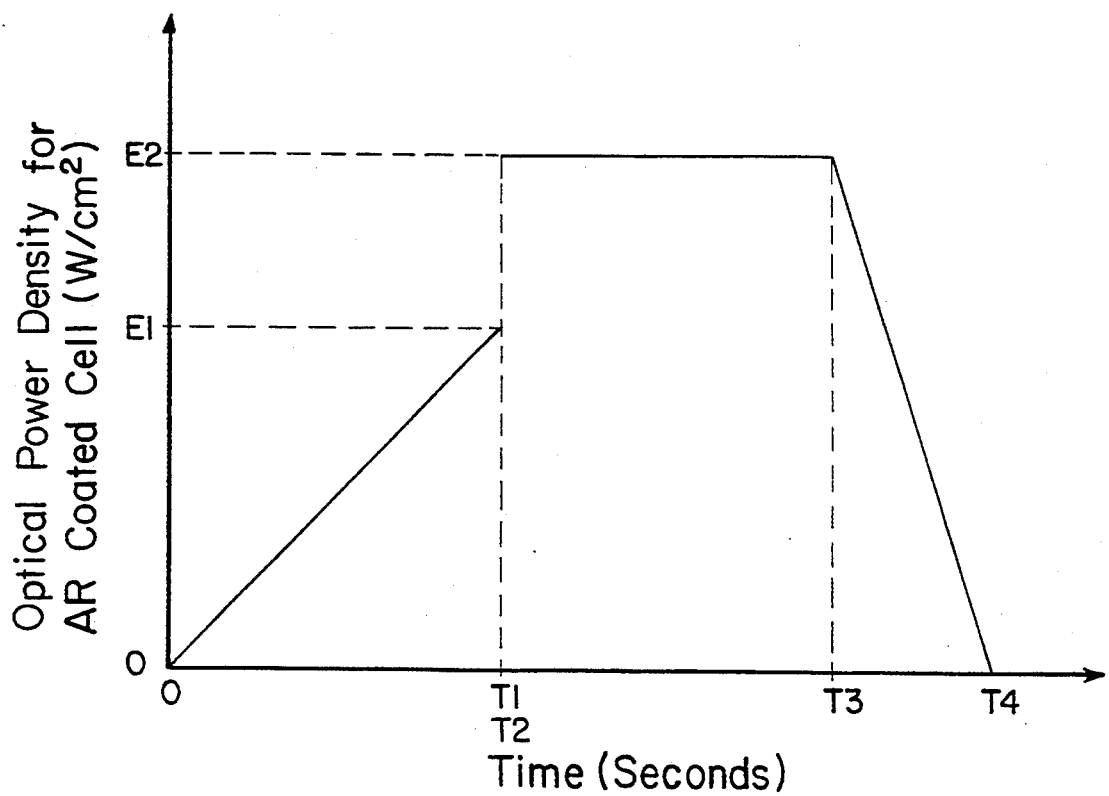
FIG. 4 is a graph or profile of the energy levels versus time of the incident electromagnetic radiation applied according to the preferred embodiment of the invention wherein an instantaneous increase in energy level is used.

A semiconductor device 4 comprising a silicon substrate 1 having an aluminum layer 2 deposited on its bottom surface 10 is alloyed, according to this invention, by illuminating the top surface 9 of the semiconductor device 4 with optical energy of a predetermined energy level, duration, and wavelength according to the timing schedule illustrated in either FIG. 3 or FIG. 4. The electromagnetic radiation source 8 in FIG. 1, such as a tungsten-halogen lamp, illuminates the semiconductor device 4 with infrared electromagnetic radiation 7, i.e., electromagnetic radiation having wavelengths of about 700 nanometers or longer, i.e. predominantly infrared radiation, so that the incident 7 electromagnetic radiation is normally incident to the semiconductor device 4. The incident infrared electromagnetic radiation 7 is mostly transmitted through the silicon substrate 1 to the aluminum layer 2 deposited on the bottom surface 10 of the silicon substrate 1. Therefore, there is little or no extraneous heating of the silicon substrate 1 from the infrared portion of the incident electromagnetic radiation 7. Instead the transmitted infrared electromagnetic radiation 12 is absorbed by the aluminum layer 2 and at the silicon/aluminum interface, where it is converted into heat sufficient to melt and alloy the aluminum with the bottom surface 10 of the silicon substrate 1. This alloying process creates a thin, uniform Si-Al alloy layer 3, as illustrated in FIG. 2, between the silicon substrate 1 and the deposited aluminum layer 2. When processed according to this invention, the thin Si-Al alloy layer 3 as shown in FIG. 4 is largely devoid of detrimental spikes and hillocks.

According to this invention, as shown in FIG. 3, the energy level of the illuminating electromagnetic radiation is raised at a fairly constant rate for a time T1 until it reaches energy level E1. This initial time interval from zero to T1 is used to raise the temperature of the metal layer 2 to some temperature level approaching, but still under the melting temperature of aluminum, from which the remainder of the process is staged. During time interval T1 to T2, the energy level is increased rapidly from energy level E1 to energy level E2 to raise the temperature at the silicon/aluminum interface rapidly into the melt regime or alloying range so that there is no time for diffusion of the silicon into the aluminum. In fact, if the alloying temperature is confined initially to the interface region, melting of the entire thickness of the aluminum layer can be avoided while melting and alloying the entire interface 10 region occurs. The energy level is then held substantially constant at E2 during the time interval of T2 to T3 to allow alloying of the desired thickness. It is best to keep the alloy layer 3 very thin to maintain high optical reflectance as opposed to a thicker, graded alloy layer that would absorb or transmit light. Enough energy is supplied during time interval of T2 to T3 to quickly overcome and avoid isolated deformities or voids in the silicon during melting at the interface that could otherwise be the precursors of spike formation. Finally the energy level is decreased at a fairly constant rate to zero during the time interval of T3 to T4.

In the preferred embodiment, an instantaneous increase in energy level from E1 to E2 at time T1, thereby making the time interval T1 to T2 essentially zero seconds, as illustrated in FIG. 4, enables the silicon and the aluminum at the interface 10 to melt and alloy uniformly over the entire interface area and almost instantaneously during time interval T2 to T3. Therefore, there is no time for diffusion of the silicon into the aluminum, or even melting of the entire aluminum layer 2, to take place. The time interval of T2 to T3 determines the thickness of the Si-Al alloy interface 3 (FIG. 2). The longer the time interval T2 to T3, the thicker the Si-Al alloy interface 3. The thickness of the Si-Al interface 3 can also be increased by increasing the value of E2. The time intervals and the optical power must be controlled so that the interface melts as an alloy.

Figure 5:
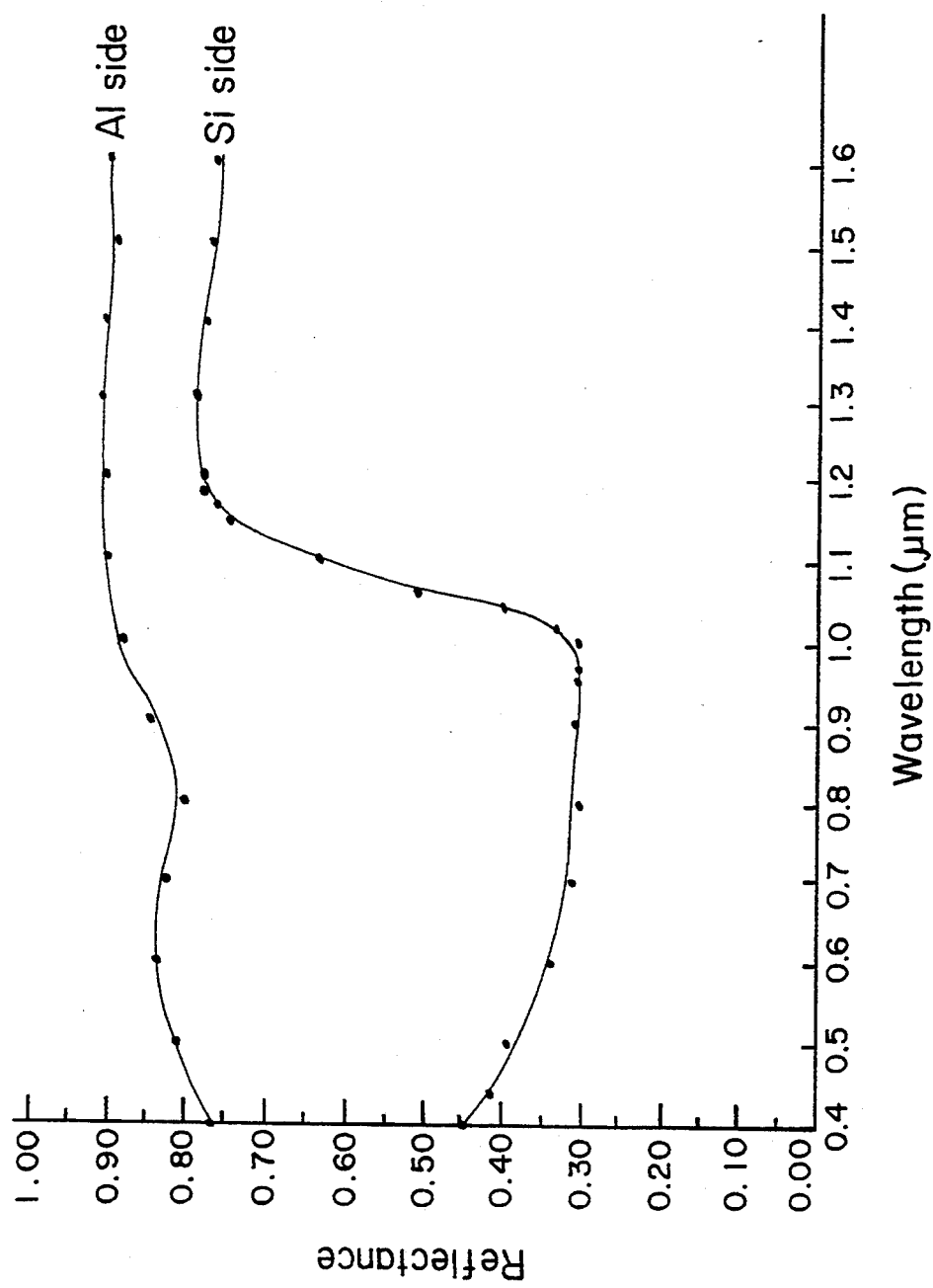
FIG. 5 shows the reflectance characteristics of an alloy interface produced according to this invention between a silicon semiconductor and an aluminum metal contract measured from both the silicon and the aluminum sides.

Typically, the total alloying time according to this invention occurs in less than one minute. For example, but not for limitation, the time T1 can be in the range of about 15 to 25 seconds (preferably about 20 seconds) during which the optical power density of the incident radiation raises to the initial level E1 in the range of about 1.2 to 2.0 W/cm$^2$ (watts per square centimeter) (preferably about 1.6 W/cm$^2$). At that stage, the temperature at the silicon/aluminum interface 10 is still below the 800° C. melting point of the aluminum layer 2 and preferably about 400° C. The time interval T1 to T2 extends about zero to 10 seconds (preferably less than 5 seconds or about 3 seconds) during which the optical power density is increased from E1 level to the E2 level, which is in the range of about 2.4 to 3.4 W/cm$^2$ (preferably about 2.9 W/cm$^2$) to raise the temperature at the interface 10 to above the 800° C. melting temperature of silicon so that Si-Al alloying can occur at the interface 10. This abrupt increase in energy to E2 melts the whole interface 10 uniformly and almost instantaneously—too fast for pits and spikes to form. Once the interface is melted, heat conducts laterally along the interface 10 rather than vertically into the aluminum layer 2 or into the substrate 1. Therefore, silicon diffusing into the aluminum layer 2 and leaving voids in the substrate that would then be filled with melted aluminum to form spikes is avoided. The energy level E2 is held substantially constant during the time interval T2 to T3 of about 12 to 24 seconds (preferably about 17 seconds) to allow alloying to occur in a layer 3 (FIG. 2), preferably of only about 50 to 100 Å thickness. During this T2 to T3 interval, the interface 10 melts and alloys uniformly and with no diffusion. The cool down period between T3 and T4 of about 4 to 12 seconds (preferably about 7 seconds) allows a highly controlled epitaxial growth of a thin layer of Si-Al alloy 3 between the silicon substrate 1 and the aluminum layer 2, as shown in FIG. 2, preferably only about 50 to 100 Å thick. The resulting Si-Al alloy is an eutectic composition in that its melting point is lower than the melting point of either of its individual silicon and aluminum components. The epitaxial alloy structure 3 enables very low electrical resistivity between the semiconductor 1 and the metal layer 2, and the thin, abrupt alloy layer is highly reflective. FIG. 5 shows the reflectivity of the alloy interface 3 from both the silicon and the aluminum sides.

While the method of this invention results in minimal heating of the atmosphere immediately surrounding the semiconductor device 4, it is preferred, though not required, to perform this alloying method in an inert environment, to eliminate any chance of contamination or oxidation. Such an inert environment could be created by providing a quartz chamber 6, as illustrated in FIG. 1, with an inlet port 13 and an outlet port 14 for flowing an inert gas, such as argon, through the chamber 6. The quartz chamber 6 may contain stands 16 to support semiconductor device 4. Other inert gases, such as helium, or reducing gases, such as hydrogen, could be used, however, with equal effectiveness.

A optional filter 15 may be used to filter out unwanted wavelengths of radiation that might otherwise be absorbed by silicon substrate 1 and cause undesirable heating in the silicon substrate 1. Other wavelengths, optical energy levels, and timing schedules might be more appropriate and optimal for other materials that can be processed within the scope of this invention. Also, it may be feasible to mix certain desired wavelengths, such as including some ultraviolet with the infrared to attain and control various temperature levels for different semiconductor and metal layer materials, in which case the optical filter 15 might be designed or assembled to selectively pass more than one wavelength.

The foregoing description is considered as illustrative only of the principles of the invention. Furthermore, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims which follow.

The embodiments of the invention in which an exclusive property or privilege is claimed are defined as follows:

1. A method of alloying a metal layer deposited on a second surface of a transparent semiconductor substrate that has a first surface and a second surface, comprising the steps of:
    illuminating the first surface of the semiconductor substrate with electromagnetic radiation having a wavelength that is substantially transmitted by the semiconductor substrate and which is substantially absorbed at the interface of the metal layer with the second surface for a time duration and energy level schedule substantially as follows:
    increasing the energy level from an initial starting point of zero (0) to a first energy level E1 during an initial time interval from zero (0) to T1;
    increasing the energy level at an increased rate from E1 to a second energy level E2 during a time interval between T1 and T2;
    maintaining the energy level E2 fairly constant during a time interval between T2 and T3; and
    decreasing the energy level from E2 back to zero (0) during a time interval between T3 and T4.

2. The method of claim 1, including the step of positioning said semiconductor substrate in an inert environment prior to the steps of illuminating the semiconductor substrate with electromagnetic radiation.

3. The method of claim 2, including the step of illuminating said semiconductor substrate with electromagnetic radiation from a direction normal to said second surface.

4. The method of claim 3, wherein said electromagnetic radiation includes wavelengths in the infrared region.

5. The method of claim 1, wherein said first energy level E1 in the range of about 1.2 to 2.0 W/cm$^2$.

6. The method of claim 5, wherein said first energy level E1 is about 1.6 W/cm$^2$.

7. The method of claim 1, wherein said second energy level E2 is in the range of about 2.4 to 3.4 W/cm$^2$.

8. The method of claim 7, wherein said second energy level E2 is about 2.9 W/cm$^2$.

9. The method of claim 1, wherein said time T1 is in the range of about 15 to 25 seconds.

10. The method of claim 9, wherein said time T1 is about 20 seconds.

11. The method of claim 1, wherein the time interval from T1 to T2 is in the range of about zero to 10 seconds.

12. The method of claim 11, wherein the time interval from T1 to T2 is about 3 seconds.

13. The method of claim 1, wherein the time interval from T2 to T3 is in the range of about 12 to 24 seconds.

14. The method of claim 13, wherein the time interval from T2 to T3 is about 17 seconds.

15. The method of claim 1, wherein the time interval from T3 to T4 is about 4 to 12 seconds.

16. The method of claim 15, wherein the time interval from T3 to T4 is about 7 seconds.

17. The method of claim 1, wherein the energy level is increased form zero to E1 at a fairly constant first rate of increase.

18. The method of claim 17, wherein the energy level is increased from E1 to E2 at fairly constant second rate of increase that is higher than said first rate of increase.

19. The method of claim 17, wherein the energy level is increased from E1 to E2 almost instantaneously.

20. The method of claim 1, wherein the energy level is decreased from E2 to zero at a fairly uniform rate of decrease.

21. The method of claim 1, wherein the substrate comprises silicon and the metal layer comprises aluminum, and wherein the second energy level E2 provides sufficient energy to melt the aluminum and silicon at the aluminum and silicon interface quickly enough to avoid formation of pits and spikes.

22. The method of claim 1, wherein second energy level E2 and the time interval T2 to T3 are sufficient to alloy a layer of silicon and aluminum about 50 to 100 Å thick.

23. The method of claim 22, wherein the time interval from T3 to T4 is sufficient to allow epitaxial growth of crystal structures in the Si-Al alloy layer.

* * * * *